(12) United States Patent
Kelekar et al.

(10) Patent No.: US 9,177,849 B2
(45) Date of Patent: Nov. 3, 2015

(54) CHUCK FOR MOUNTING A SEMICONDUCTOR WAFER FOR LIQUID IMMERSION PROCESSING

(71) Applicant: Intermolecular, Inc., San Jose, CA (US)

(72) Inventors: Rajesh Kelekar, Los Altos, CA (US);
Glen Eric Egami, San Jose, CA (US);
Aaron T. Francis, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 511 days.

(21) Appl. No.: 13/719,136

(22) Filed: Dec. 18, 2012

(65) Prior Publication Data

US 2014/0166050 A1   Jun. 19, 2014

(51) Int. Cl.
*H01L 21/687* (2006.01)
*H01L 21/683* (2006.01)
*G03F 7/20* (2006.01)

(52) U.S. Cl.
CPC ............ *H01L 21/6838* (2013.01); *G03F 7/707* (2013.01); *H01L 21/68735* (2013.01); *H01L 21/68757* (2013.01); *Y10T 279/11* (2015.01)

(58) Field of Classification Search
CPC .......................... G03F 7/707; H01L 21/68735
See application file for complete search history.

(56) References Cited

U.S. PATENT DOCUMENTS

| | | | |
|---|---|---|---|
| 4,932,358 A | 6/1990 | Studley et al. | |
| 5,805,408 A | 9/1998 | Maraschin et al. | |
| 6,329,301 B1 | 12/2001 | Zahorik et al. | |
| 6,439,963 B1 | 8/2002 | Rangarajan et al. | |
| 6,506,099 B1 | 1/2003 | Bartlett | |
| 6,616,772 B2 | 9/2003 | de Larios et al. | |
| 6,623,333 B1 | 9/2003 | Patel et al. | |
| 6,736,696 B2 | 5/2004 | Peng et al. | |
| 6,925,348 B2 | 8/2005 | Kistler et al. | |
| 7,301,607 B2 | 11/2007 | Hazelton et al. | |
| 7,446,850 B2 | 11/2008 | Hultermans et al. | |
| 7,446,859 B2 | 11/2008 | Shneyder et al. | |
| 7,501,226 B2 | 3/2009 | Lin et al. | |
| 7,764,356 B2 | 7/2010 | Hultermans et al. | |
| 7,869,002 B2 | 1/2011 | Shneyder et al. | |
| 8,003,968 B2 | 8/2011 | Ottens et al. | |
| 2004/0160582 A1* | 8/2004 | Lof | G03F 7/70341 355/30 |
| 2010/0315610 A1 | 12/2010 | Hultermans et al. | |

* cited by examiner

*Primary Examiner* — Michael Kornakov
*Assistant Examiner* — Ryan Coleman

(57) ABSTRACT

Chucks for mounting and retaining semiconductor wafers during processing are described, particularly suited for wafer processing involving total immersion of the wafer-chuck structure in a liquid. Chuck structures are disclosed for preventing or hindering processing chemicals from contacting and contaminating large portions of the underside of the wafer undergoing processing, limiting such chemical contact to readily cleaned, relatively small annular regions on the periphery of the wafer. Embodiments include structures with supplemental gas flows on the underside of the wafer as well as the creation of gas/liquid meniscusci to prevent chemical penetration of the wafer's underside. Methods of processing semiconductor wafers employing such chucks are also described.

12 Claims, 5 Drawing Sheets

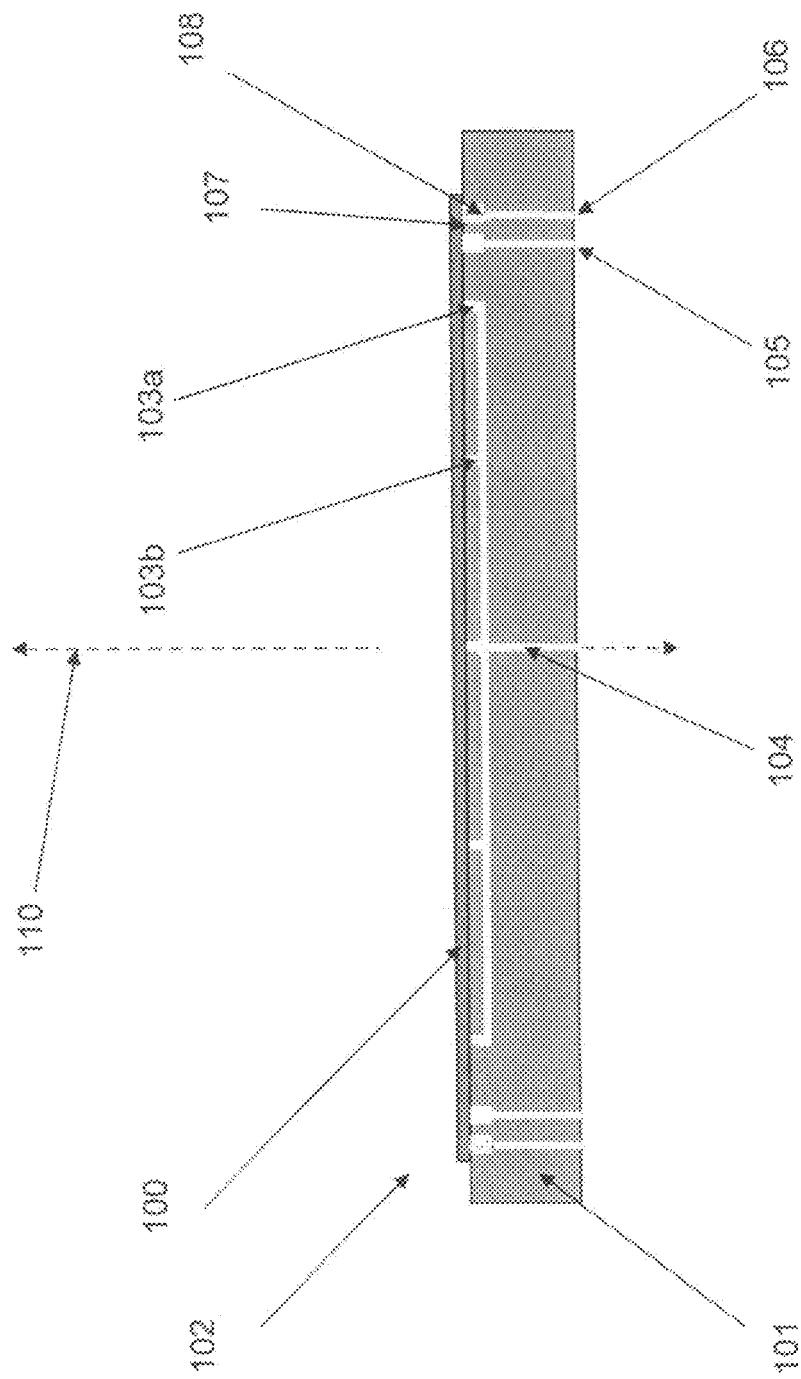

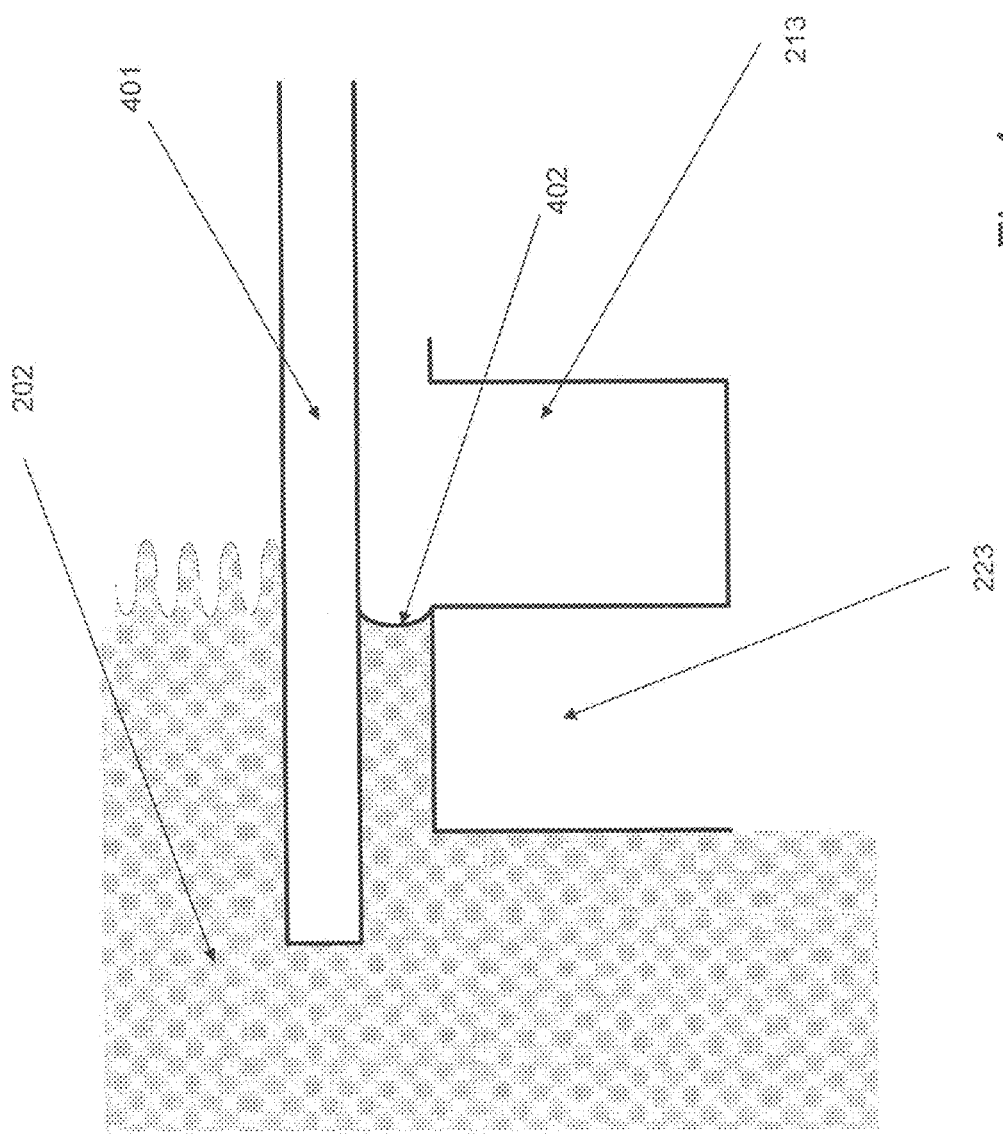

CHUCK FOR MOUNTING A SEMICONDUCTOR WAFER FOR LIQUID IMMERSION PROCESSING

BACKGROUND

The subject matter described herein relates generally to the field of semiconductor device manufacturing, particularly to a chuck for mounting semiconductor wafers during processing and a method of semiconductor processing, and more particularly to a chuck and method of processing that limit unwanted exposure of unprocessed portions of the wafer to processing chemicals while securing the wafer in a manner suitable for noncontact combinatorial wafer processing.

Semiconductor electronic devices are found in virtually every segment of the modern economy. Continual efforts are made to improve such devices, to develop new, better and cheaper devices, to improve the materials used in such devices and to improve manufacturing processes. There is an on-going need in the art for improvements in all aspects related to semiconductor device design, manufacturing and use.

A typical semiconductor device includes numerous different materials, interfaces between materials and subsystems whose electrical, thermal, chemical and mechanical properties affect the overall performance of the device. Different semiconductor materials with different dopants and doping levels are typically present, along with various conductors and insulators, all in various geometric configurations with numerous interfacial regions where such materials come into contact, may blend to form alloys or distinct compounds. Additional complexity can arise from effects of processing. Thus, in designing such devices, or striving to improve the materials and/or manufacturing processes, it is important to know the properties of such materials and interfaces, how such properties are expected to change in response to contemplated changes in materials, geometry and/or processing, and to improve processing equipment and techniques to reduce unwanted exposures of device locations to undesirable chemicals.

Techniques for conducting dozens or even hundreds of experiments in parallel have been developed, and continue to be developed, under the general label "combinatorial processing." These techniques obviously speed up R&D by a tremendous factor, allowing numerous tests to be conducted, and data collected, concurrently. One recent discussion of combinatorial techniques applied to materials science can be found in "Combinatorial Materials Science" by B. Narasimhan et al (eds)., Wiley-Interscience (2007). In particular, various materials, geometries and processing conditions for the manufacture of semiconductor devices can be tested in parallel, exemplified by the specific applications of combinatorial processing to semiconductor devices by Intermolecular, Inc. of San Jose, Calif., employing their High-Productivity Combinatorial™ (HPC™) technology and various devices and procedures related thereto. Such technologies also are known as high-throughput combinatorial technology or combinatorial technology. For economy of language we refer generally to such combinatorial techniques as HPC.

HPC processing typically involves isolating numerous regions on the surface of a semiconductor wafer ("wafer") and processing these isolated regions pursuant to a plurality of different processing protocols. Isolation of these distinct regions has conventionally required the use of a cell that contacts the surface of the wafer, inside which the processing can occur without interference or contamination from other cells. However, contact with the wafer is a dangerous procedure that can easily result in damage to the wafer, or cause particles to be left on the wafer, both of which may affect device performance, especially as semiconductor circuit components become ever smaller and thus more susceptible to small disturbances in or on the wafer. Therefore, noncontact sealing and isolation is an active area of interest in the semiconductor industry.

SUMMARY

Accordingly embodiments of the subject matter described herein relate to chucks for holding a semiconductor wafer during processing, and to methods of wafer processing that substantially maintain cell isolation, even for noncontact isolation procedures, and to chucks and methods that reduce or eliminate cross-contamination from one processing step to subsequent processing steps, even when liquid immersion processing is performed.

Pursuant to some embodiments, the semiconductor wafer is mounted directly on a chuck typically made of an engineered plastic such as HALAR® (a copolymer of ethylene and chlorotrifluoroethylene sold by Solvay Solexis). The engineered plastic for the chuck is selected such that it can be machined to the required degree of flatness so as to maintain the wafer in the flat geometry required by the isolation and processing to be performed.

A central region of this chuck typically contains channels or grooves therein, through which a vacuum can be applied, holding the wafer firmly in place on the chuck. The number and configuration of the vacuum channels are such as to hold the wafer firmly in place during processing but not cause unacceptable degradation in the wafer's flatness when vacuum is applied.

No O-ring is used between the wafer and the chuck to preserve flatness, but the absence of the O-ring may allow process chemicals to contaminate the underside of the wafer (particularly during immersive chemical processing steps) exacerbating cross-contamination.

Other structures and techniques are described to prevent the processing chemicals from penetrating and extensively contaminating the underside of the wafer, with such contamination generally limited to an annular region around the outer edge of the wafer that can readily be cleaned with a suitable solvent (typically deionized, "DI," water).

These and other features will be understood upon consideration of the following detailed description of and the accompanying drawings.

BRIEF DESCRIPTION OF THE DRAWINGS

To facilitate understanding, identical reference numerals have been used, where possible, to designate identical elements that are common to the figures. The drawings herein are schematic, not to scale and the relative dimensions of various elements in the drawings are not to scale.

The teachings herein can readily be understood by considering the following detailed description in conjunction with the accompanying drawings, in which:

FIG. 1A is a cross-sectional side view through a diameter of the wafer-chuck assembly of a dual ring embodiment.

FIG. 4 is a schematic cross-sectional expanded depiction of the edge region of a triple ring embodiment including wafer 401.

DETAILED DESCRIPTION

Figure 1B:
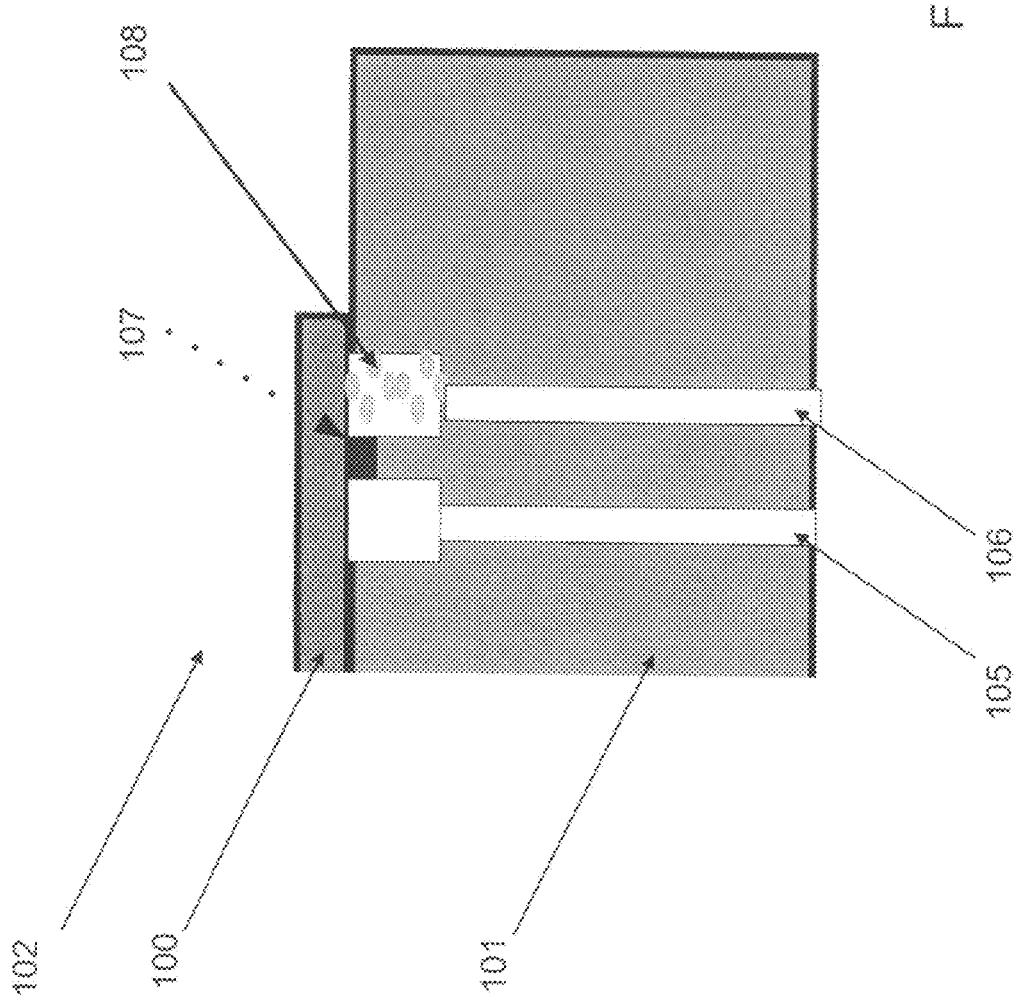
FIG. 1B is an expanded view of the right end of the wafer and chuck structure depicted in FIG. 1A.

After considering the following description, those skilled in the art will clearly realize that the present teachings can be readily used for mounting a semiconductor wafer firmly in position during processing and, in addition, reducing the chances of unacceptable cross-contamination arising from chemicals from a processing step contaminating a subsequent processing step, and/or limiting contamination to readily cleaned portions of the wafer.

Cross-contamination is a particular challenge when the processing of the wafer calls for total immersion of the wafer and chuck in a chemical bath. To be concrete in our descriptions, we describe this case in detail, understanding that the structures and techniques described herein may be advantageous in other wafer processing environments as would be apparent to those having ordinary skills in the art.

Noncontact isolation poses challenges for the chuck into which the wafer is mounted (typically vacuum mounted) and retained firmly in position for processing, as well as challenges to methods of processing the wafer. For example, lateral movement of the wafer during processing can lead to loss of the seal between the cell and wafer, and/or loss of isolation of one or more cells. Thus, there is a need in the art for a wafer chuck and method of wafer processing that ensures the semiconductor wafer is held firmly in position during processing without significant lateral movement.

Noncontact isolation typically requires a rather precise interface between the cell and the wafer as the cell approaches the wafer, maintained over the entire surface of the wafer (a typical wafer is a circular disc approximately 12 inches in diameter). This in turn requires that the surface of the wafer be very flat over its entire active surface, typically flat to within about ±0.001 inch over the entire surface. This flatness needs to be maintained even as the wafer is mounted and resides in a chuck for processing. For example, an O-ring seal between the wafer and the chuck can result in distortion of the wafer and loss of flatness when the vacuum is applied to hold the wafer in place. Thus, there is a need in the art for a chuck to hold a semiconductor wafer during processing without distortion and without significant loss of flatness and a method of processing that maintains wafer flatness throughout.

Yet another challenge to be met in semiconductor processing is the avoidance of cross-contamination from one tool to another as the wafer is moved from tool to tool during its processing sequence. That is, residual chemicals from one processing step (step-1) can still be present on the wafer as it enters the subsequent processing step (step-2), thereby degrading or destroying the processing of step-2. This is a particular challenge when step-1 includes the exposure of portions of the wafer that are difficult to clean thoroughly before step-2, including total immersion of the wafer-chuck assembly in the processing chemicals. Thus, there is a need in the art for a chuck to hold a semiconductor wafer during processing that prevents chemical contamination of those portions of the wafer difficult to clean and prone to carrying contaminating chemicals from one processing tool to another and a method of processing the wafer so as to reduce or eliminate cross-contamination.

Dual Ring Structure

FIG. 1A is a cross-sectional view of a semiconductor wafer 100 mounted on a chuck 101 and immersed in a liquid chemical bath 102. It is understood in FIG. 1A that the wafer 100 and chuck 102 are typically circular in shape and FIG. 1A is a section along a diameter of this circular structure. That is, rotation of the view presented in FIG. 1A about the central vertical axis 110 of FIG. 1A generates the three dimensional structure. Since FIG. 1A has mirror symmetry about the central vertical axis 110, reference numbers applied on one half of the figure (for clarity of depiction) are understood to apply to the symmetrically opposed portion of the figure as well.

Vacuum channels 103a and 103b secure wafer 100 to chuck 101 by means of a vacuum drawn through channel 104 and connected to channels 103a, 103b. Two circular vacuum channels 103a, 103b and one central channel 104 are depicted in FIG. 1A as a matter of convenience. Different numbers of channels can also be used within the scope of the subject matter described herein.

Outside the outermost vacuum channel of the chuck 103a, two grooves or rings are placed in the chuck, an inner ring 105 and an outer ring 106, depicted in expanded view in FIG. 1B. The chuck structure 107 between rings 105 and 106 is lowered slightly below the level of the wafer so overflow from one of the rings has relatively unimpeded access to the other ring across this lowered ledge 107. A vacuum is applied to the outer ring 106 while a positive pressure of a suitable flushing gas is delivered to the inner ring 105 (where "suitable" indicates unreactive with the chuck, wafer or processing chemicals with which the gas comes into contact, typically $N_2$). Optionally, a vacuum sealing ring 108 can be inserted in outer ring 106, so long as 108 does not cause the wafer to rise sufficiently above the plane of the chuck to cause distortion and does not significantly impede the flow of vapor or liquid between 105 and 106.

In this embodiment, processing chemicals finding their way underneath the edges of the wafer will be sucked into the vacuum of the outer ring 106, while the gas flow from the inner ring 105 over the lowered ledge 107 and into the outer vacuum ring 106 will further prevent the processing chemicals 102 from penetrating further into the underside of the wafer. Thus, any contamination of the wafer's underside due to processing chemicals is confined to a relatively small annular region lying outside the inner (gas delivery) ring of the chuck 105, easily accessible for solvent cleaning as the wafer is dismounted from the chuck.

However, the pressure of the unreactive gas through 105 cannot be too large lest it bubble into the bath of processing chemicals 102 surrounding the chuck and thereby cause foaming and serious contamination of the tool. Furthermore, the loss of processing chemical (presumably not recovered or recycled) through ring 106 may be unacceptably large. For these reasons, other structures and procedures have also been developed.

Triple Ring Structure

Figure 2:
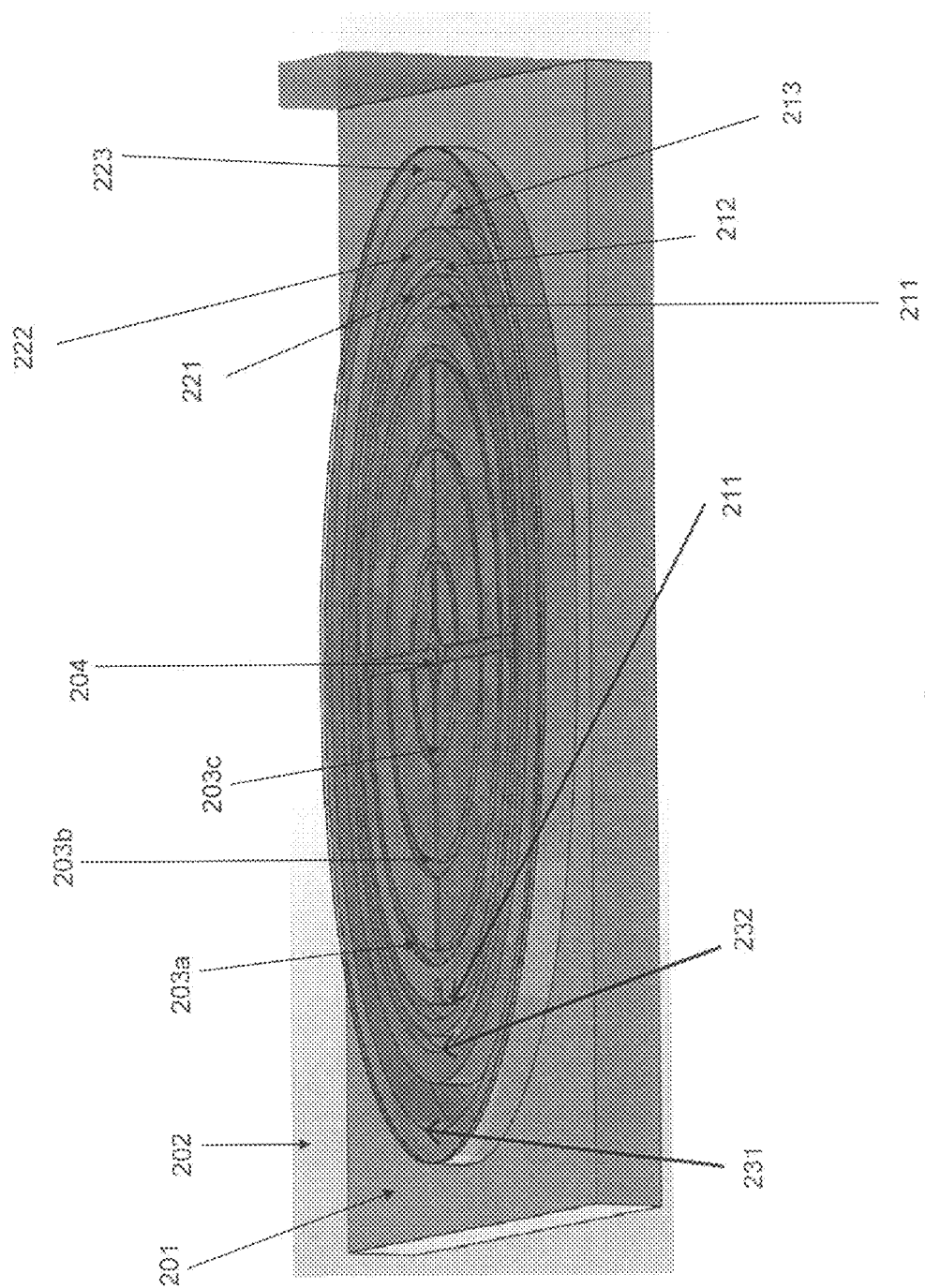
FIG. 2 is a perspective view of a triple ring chuck structure.

FIG. 2 is a perspective view of alternative embodiments of a chuck for wafer processing. Chuck 201 is shown immersed in a chemical bath 202. The wafer that sits on top of chuck 201 is not shown in FIG. 2 in order to have a more clear depiction of the channel, ring and ledge structure of chuck 201. However, when mounted in chuck 201, the wafer would extend to ledge 223, covering ring 213.

Vacuum channels 203a, 203b and 203c are depicted in FIG. 2 connected to a central vacuum channel 204 in a manner analogous to FIG. 1 with the addition of one more vacuum channel. The addition of a third vacuum channel in addition to the two depicted in FIG. 1 can help ensure adequate flatness for the wafer but is not inherently necessary in these embodiments.

Outside the outermost vacuum channel of the chuck 203a, three substantially concentric and substantially ring-shaped channels or rings are fabricated in the engineered plastic material, labeled from innermost to outmost Ring 211, Ring 212 and Ring 213. For convenience, the region between Ring 211 and Ring 212 is labeled Ledge 221, Ledge 222 between Ring 212 and Ring 213, Ledge 223 denoting the region outside Ring 213. This triple ring structure helps ensure pressure uniformity both during processing of the wafer and during subsequent cleaning. The relative depths of the rings and the relative heights of the ridges (or ledges) between the rings are important characteristics in the determining the performance of the chucks pursuant to such embodiments.

Figure 3:
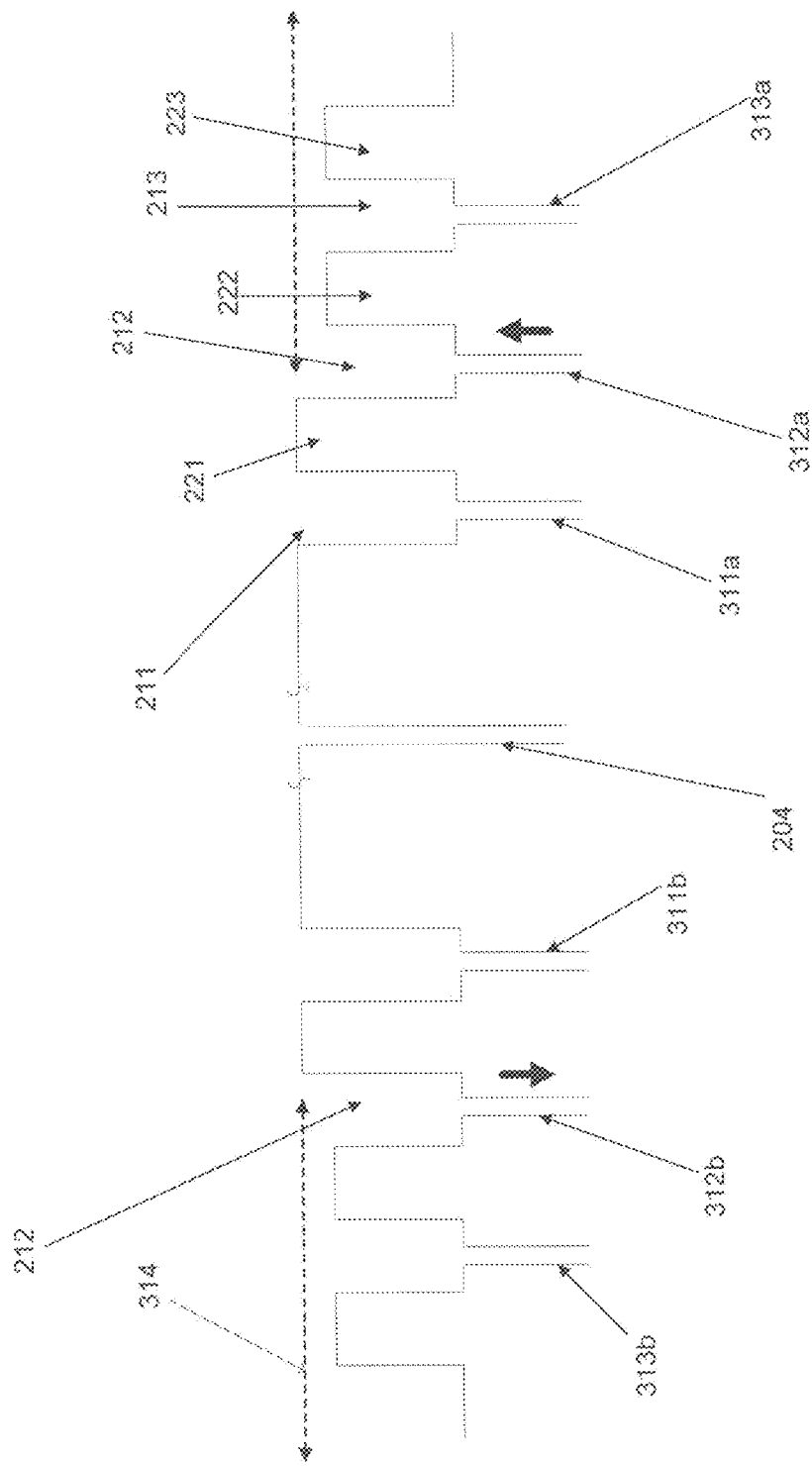
FIG. 3 is a schematic cross-sectional depiction of a triple ring embodiment.

A cross-sectional depiction of the chuck of FIG. 2 is provided in FIG. 3. Ring 211 is typically connected to the atmosphere in order to provide venting by means of port(s) 311. Ring 211 may have one or more ports, two of which are depicted as 311a and 311b in FIG. 3. It is a matter of engineering decision whether adequate flow requires two (or a certain number of ports) in certain positions, but we depict two ports here as a matter of convenience, not limitation. Ring 212 has at least one port for gas inflow (depicted as 312a) and at least one port for gas outflow (depicted as 312b), suitable for containing and flowing any convenient gas not reactive with the materials or the processing chemicals, such as $N_2$. A different number and/or location of ports can be used to generate different flow patterns in Ring 212, as could be determined by routine experimentation.

Ledge 221 between Ring 211 and Ring 212 is substantially the same height as that of the chuck (and coplanar therewith) as depicted in FIG. 3, forming a seal with the underside of the wafer and generally hindering flow of material between Ring 211 and Ring 212.

Ring 213 has one or more ports for the input of a solvent (typically DI water) for example 313a, and one or more ports for a applying a vacuum to Ring 213, for example 313b. Ledge 222 between Ring 212 and Ring 213 is lower than the plane of the chuck 314 by (typically) about 0.002-0.007 inches, allowing flow of liquids and gases between Ring 212 and Ring 213. Ledge 223 outside Ring 213 is also lower than the plane of the chuck by about 0.002-0.007 inches. Process chemicals into which the wafer 401 and chuck assembly may be immersed, 202, will readily flow into this gap between the top of Ledge 223 and the bottom of the wafer towards Ring 213, as depicted in FIG. 4.

During wafer processing, gas is caused to flow into Ring 212 which spills over Ledge 222 into Ring 213, filling Ring 213 and forming a meniscus-type barrier 402 between the process chemicals and Ring 213 atop Ledge 223. This tends to exclude chemicals from Ring 213 as well as from the structures to the interior of Ring 213—Ring 211 and 212, Ledge 221, 222. However, Ledge 223 and the underside of the wafer 401 above Ledge 223 will be exposed to process chemicals.

To purge residual process chemicals from the system following processing, DI water is admitted to Ring 213 while the gas flow is increased in Ring 212. This creates a water-gas meniscus barrier between Ledge 222 and Ring 212 but permits free flow of DI water on Ledge 222, Ring 213 and Ledge 223, removing residual process chemicals with the outflowing water, leaving the wafer suitable for transfer and use in another tool. The water rinse interface is depicted as 232 while the process liquid interface is depicted as 231.

Although various embodiments which incorporate the teachings of the subject matter described herein have been shown and described in detail herein, those skilled in the art can readily devise many other varied embodiments that still incorporate these teachings.

What is claimed is:

1. A chuck for holding a wafer, the chuck comprising:
   a surface; wherein the surface comprises
      a plurality of vacuum channels connected to a vacuum source;
      an inner ring; and
      an outer ring;
   wherein the inner ring surrounds the plurality of vacuum channels;
   wherein the inner ring is operable to carry flushing gases;
   wherein the outer ring surrounds the inner ring;
   wherein the outer ring is in fluid communication with the inner ring;
   wherein the outer ring is connected to a vacuum source and is operable for drawing a vacuum;
   an exterior ring surrounding the outer ring and in fluidic communication with the outer ring;
   wherein the exterior ring includes one or more ports that are connected to a source of solvent and are configured for supplying solvent;
   wherein the exterior ring includes one or more ports that are connected to a vacuum source and are configured for applying a vacuum; and
   wherein the exterior ring includes one of more ports configured for outflow of solvent.

2. A chuck as in claim 1 wherein the chuck material is an engineered plastic.

3. A chuck as in claim 2 wherein the engineered plastic is a copolymer of ethylene and chlorotrifluoroethylene.

4. A chuck as in claim 1 wherein the chuck is substantially circular in shape with a diameter of approximately 12 inches.

5. A chuck as in claim 1 wherein the surface is flat to within approximately ±0.001 inch over its entire surface.

6. A chuck as in claim 1 further comprising one or more inner ring venting ports suitable for venting the inner ring to the atmosphere.

7. A chuck as in claim 1 further comprising at least one gas inflow port in the outer ring and at least one gas outflow port in the outer ring.

8. A chuck as in claim 1 wherein a ledge between the inner ring and the outer ring is substantially coplanar with the surface of the chuck.

9. A chuck as in claim 1 wherein a ledge between the outer ring and the exterior ring is lower than a plane of the surface of the chuck.

10. A chuck as in claim 9 wherein the ledge between the exterior ring and the outer ring is in the range from 0.002 inches to 0.007 inches below the surface of the chuck.

11. A chuck as in claim 1 wherein a ledge outside the exterior ring is lower than a plane of the surface of the chuck.

12. A chuck as in claim 11 wherein the ledge outside the exterior ring is approximately in the range from 0.002 inches to 0.007 inches below the surface of the chuck.

* * * * *